(12) United States Patent
Pan et al.

(10) Patent No.: US 10,256,236 B2
(45) Date of Patent: Apr. 9, 2019

(54) FORMING SWITCH CIRCUIT WITH CONTROLLABLE PHASE NODE RINGING

(71) Applicant: Alpha and Omega Semiconductor Incorporated, Sunnyvale, CA (US)

(72) Inventors: Ji Pan, San Jose, CA (US); Sik Lui, Sunnyvale, CA (US)

(73) Assignee: ALPHA AND OMEGA SEMICONDUCTOR INCORPORATED, Sunnyvale, CA (US)

(*) Notice: Subject to any disclaimer, the term of this patent is extended or adjusted under 35 U.S.C. 154(b) by 0 days.

(21) Appl. No.: 16/053,607

(22) Filed: Aug. 2, 2018

(65) Prior Publication Data

US 2018/0342506 A1   Nov. 29, 2018

Related U.S. Application Data

(62) Division of application No. 15/294,518, filed on Oct. 14, 2016, now Pat. No. 10,103,140.

(51) Int. Cl.

| | |
|---|---|
| *H01L 27/088* | (2006.01) |
| *H01L 21/306* | (2006.01) |
| *H01L 21/308* | (2006.01) |
| *H01L 21/8234* | (2006.01) |
| *H01L 27/02* | (2006.01) |
| *H01L 29/06* | (2006.01) |
| *H01L 29/10* | (2006.01) |
| *H01L 29/423* | (2006.01) |
| *H01L 29/66* | (2006.01) |
| *H02M 3/158* | (2006.01) |

(52) U.S. Cl.
CPC .......... *H01L 27/088* (2013.01); *H01L 21/308* (2013.01); *H01L 21/30604* (2013.01); *H01L 21/823456* (2013.01); *H01L 21/823487* (2013.01); *H01L 27/0207* (2013.01); *H01L 29/0696* (2013.01); *H01L 29/1079* (2013.01);
(Continued)

(58) Field of Classification Search
CPC ............... H01L 27/088; H01L 29/4236; H01L 29/1095
See application file for complete search history.

(56) References Cited

U.S. PATENT DOCUMENTS

| | | | | |
|---|---|---|---|---|
| 6,072,362 A | * | 6/2000 | Lincoln ............... | H02M 7/5387 330/10 |
| 6,271,562 B1 | * | 8/2001 | Deboy ................ | H01L 29/0634 257/341 |

(Continued)

OTHER PUBLICATIONS

Non-Final Office Action for U.S. Appl. No. 15/294,518, dated Feb. 8, 2018.
(Continued)

*Primary Examiner* — Laura M Menz
(74) *Attorney, Agent, or Firm* — JDI Patent; Joshua D. Isenberg; Robert Pullman

(57) ABSTRACT

A switch circuit includes a first MOS transistor and a second MOS transistor of a same conductivity type connected in parallel between a first terminal and a second terminal of the switch circuit, the first and second MOS transistors having respective gate terminals coupled to the control terminal to receive a control signal to turn the first and second MOS transistors on or off. The first MOS transistor is characterized by a first reverse gate-to-drain capacitance ($C_{rss}$) and the second MOS transistor is characterized by a second $C_{rss}$ that is greater than the first $C_{rss}$.

11 Claims, 16 Drawing Sheets

(52) U.S. Cl.
CPC ...... *H01L 29/1095* (2013.01); *H01L 29/4236* (2013.01); *H01L 29/66621* (2013.01); *H02M 3/158* (2013.01); *H01L 21/823412* (2013.01)

(56) References Cited

U.S. PATENT DOCUMENTS

| | | | |
|---|---|---|---|
| 6,841,852 B2 | 1/2005 | Luo et al. | |
| 7,122,882 B2 | 10/2006 | Lui et al. | |
| 7,183,616 B2 | 2/2007 | Bhalla et al. | |
| 7,208,818 B2 | 4/2007 | Luo et al. | |
| 7,221,195 B2* | 5/2007 | Bhalla ................. | H01L 27/0629 257/E27.016 |
| 7,285,822 B2 | 10/2007 | Bhalla et al. | |
| 7,355,433 B2 | 4/2008 | Lui et al. | |
| 7,378,884 B2 | 5/2008 | Bhalla et al. | |
| 7,391,100 B2 | 6/2008 | Luo et al. | |
| 7,436,022 B2 | 10/2008 | Bhalla et al. | |
| 7,443,225 B2 | 10/2008 | Lui et al. | |
| 7,453,119 B2 | 11/2008 | Bhalla et al. | |
| 7,535,021 B2 | 5/2009 | Bhalla et al. | |
| 7,605,425 B2 | 10/2009 | Bhalla et al. | |
| 7,633,119 B2 | 12/2009 | Bhalla et al. | |
| 7,633,140 B2 | 12/2009 | Luo et al. | |
| 7,659,570 B2 | 2/2010 | Bhalla et al. | |
| 7,671,439 B2 | 3/2010 | Pan et al. | |
| 7,671,662 B2 | 3/2010 | Lui et al. | |
| 7,737,522 B2 | 6/2010 | Lui et al. | |
| 7,745,878 B2 | 6/2010 | Bhalla et al. | |
| 7,755,379 B2 | 7/2010 | Lui et al. | |
| 7,764,105 B2 | 7/2010 | Bhalla et al. | |
| 7,786,531 B2 | 8/2010 | Lui et al. | |
| 7,800,169 B2 | 9/2010 | Bhalla et al. | |
| 7,863,675 B2 | 1/2011 | Bhalla et al. | |
| 7,923,774 B2 | 4/2011 | Bhalla et al. | |
| 7,936,011 B2 | 5/2011 | Bhalla et al. | |
| 7,960,233 B2 | 6/2011 | Lui et al. | |
| 8,008,716 B2 | 8/2011 | Lui et al. | |
| 8,035,159 B2 | 10/2011 | Bhalla et al. | |
| 8,053,808 B2 | 11/2011 | Su et al. | |
| 8,067,822 B2 | 11/2011 | Luo et al. | |
| 8,093,651 B2 | 1/2012 | Bhalla et al. | |
| 8,119,482 B2 | 2/2012 | Bhalla et al. | |
| 8,163,618 B2 | 4/2012 | Bhalla et al. | |
| 8,169,062 B2 | 5/2012 | Luo et al. | |
| 8,174,283 B2 | 5/2012 | Bhalla et al. | |
| 8,227,330 B2 | 7/2012 | Pan et al. | |
| 8,247,288 B2* | 8/2012 | Xue ................... | H01L 23/5223 438/239 |
| 8,283,723 B2 | 10/2012 | Bhalla et al. | |
| 8,288,229 B2 | 10/2012 | Bhalla et al. | |
| 8,324,683 B2 | 12/2012 | Lui et al. | |
| 8,357,973 B2 | 1/2013 | Lui et al. | |
| 8,362,552 B2 | 1/2013 | Pan et al. | |
| 8,362,585 B1 | 1/2013 | Bhalla et al. | |
| 8,367,501 B2 | 2/2013 | Lui et al. | |
| 8,372,708 B2 | 2/2013 | Bhalla et al. | |
| 8,394,702 B2 | 3/2013 | Tai et al. | |
| 8,431,470 B2 | 4/2013 | Lui et al. | |
| 8,431,989 B2 | 4/2013 | Bhalla et al. | |
| 8,445,370 B2 | 5/2013 | Lui et al. | |
| 8,450,794 B2 | 5/2013 | Bhalla et al. | |
| 8,482,048 B2* | 7/2013 | Xue ................. | H01L 23/49562 257/307 |
| 8,580,667 B2 | 11/2013 | Lui et al. | |
| 8,586,435 B2 | 11/2013 | Pan et al. | |
| 8,597,998 B2 | 12/2013 | Bhalla et al. | |
| 8,637,926 B2 | 1/2014 | Lui et al. | |
| 8,643,071 B2 | 2/2014 | Pan et al. | |
| 8,643,135 B2 | 2/2014 | Bobde et al. | |
| 8,669,613 B2 | 3/2014 | Lui et al. | |
| 8,680,643 B2 | 3/2014 | Pan et al. | |
| 8,692,322 B2 | 4/2014 | Pan et al. | |
| 8,728,890 B2 | 5/2014 | Bhalla et al. | |
| 8,748,268 B1 | 6/2014 | Pan et al. | |
| 8,753,935 B1 | 6/2014 | Bobde et al. | |
| 8,759,908 B2 | 6/2014 | Lui et al. | |
| 8,785,278 B2* | 7/2014 | Yilmaz ............... | H01L 29/4236 438/270 |
| 8,809,143 B2 | 8/2014 | Bhalla et al. | |
| 8,809,948 B1 | 8/2014 | Yilmaz et al. | |
| 8,828,857 B2 | 9/2014 | Lui et al. | |
| 8,829,603 B2 | 9/2014 | Lui et al. | |
| 8,896,131 B2 | 11/2014 | Bhalla et al. | |
| 8,907,416 B2 | 12/2014 | Tai et al. | |
| 8,928,079 B2 | 1/2015 | Bhalla et al. | |
| 8,933,506 B2 | 1/2015 | Bobde et al. | |
| 8,946,816 B2 | 2/2015 | Bobde et al. | |
| 8,946,942 B2 | 2/2015 | Lui et al. | |
| 8,951,867 B2 | 2/2015 | Lee et al. | |
| 8,956,940 B2 | 2/2015 | Lui et al. | |
| 8,963,240 B2 | 2/2015 | Bhalla et al. | |
| 8,969,950 B2 | 3/2015 | Pan | |
| 8,980,716 B2 | 3/2015 | Lui et al. | |
| 9,006,053 B2 | 4/2015 | Pan et al. | |
| 9,013,848 B2 | 4/2015 | Lui | |
| 9,024,378 B2 | 5/2015 | Bhalla et al. | |
| 9,059,147 B1 | 6/2015 | Pan et al. | |
| 9,105,494 B2 | 8/2015 | Lee et al. | |
| 9,123,805 B2 | 9/2015 | Lui | |
| 9,136,370 B2 | 9/2015 | Lui et al. | |
| 9,136,380 B2 | 9/2015 | Yilmaz et al. | |
| 9,171,917 B2 | 10/2015 | Bobde et al. | |
| 9,190,512 B2 | 11/2015 | Lee et al. | |
| 9,214,545 B2 | 12/2015 | Tai et al. | |
| 9,219,003 B2 | 12/2015 | Lui et al. | |
| 9,230,957 B2 | 1/2016 | Lui et al. | |
| 9,236,450 B2 | 1/2016 | Bhalla et al. | |
| 9,246,347 B2 | 1/2016 | Lui et al. | |
| 9,252,264 B2 | 2/2016 | Bobde et al. | |
| 9,269,805 B2 | 2/2016 | Lui | |
| 9,281,394 B2 | 3/2016 | Yilmaz et al. | |
| 9,312,336 B2 | 4/2016 | Pan et al. | |
| 9,356,022 B2 | 5/2016 | Lee et al. | |
| 9,443,928 B2 | 9/2016 | Lui et al. | |
| 9,450,088 B2 | 9/2016 | Lee et al. | |
| 9,484,452 B2 | 11/2016 | Bobde et al. | |
| 9,502,554 B2 | 11/2016 | Bobde et al. | |
| 9,748,375 B2* | 8/2017 | Yilmaz ............... | H01L 29/4236 |
| 9,847,706 B2* | 12/2017 | Zhang .................... | H02M 1/15 |
| 10,103,140 B2* | 10/2018 | Pan .................. | H01L 21/30604 |
| 2003/0160270 A1* | 8/2003 | Pfirsch .................. | H01L 29/402 257/288 |
| 2003/0178673 A1 | 9/2003 | Bhalla et al. | |
| 2003/0183924 A1 | 10/2003 | Bhalla et al. | |
| 2005/0127532 A1 | 6/2005 | Luo et al. | |
| 2005/0145996 A1 | 7/2005 | Luo et al. | |
| 2005/0280133 A1 | 12/2005 | Luo et al. | |
| 2006/0017141 A1 | 1/2006 | Luo et al. | |
| 2006/0091505 A1 | 5/2006 | Lui et al. | |
| 2006/0108635 A1 | 5/2006 | Bhalla et al. | |
| 2006/0180855 A1 | 8/2006 | Bhalla et al. | |
| 2006/0202264 A1 | 9/2006 | Bhalla et al. | |
| 2006/0208788 A1 | 9/2006 | Bhalla et al. | |
| 2006/0209887 A1* | 9/2006 | Bhalla .................. | H01L 29/407 370/466 |
| 2006/0220107 A1 | 10/2006 | Lui et al. | |
| 2006/0249785 A1 | 11/2006 | Bhalla et al. | |
| 2006/0273379 A1* | 12/2006 | Bhalla ................. | H01L 29/4983 257/330 |
| 2007/0034901 A1 | 2/2007 | Lui et al. | |
| 2007/0075392 A1 | 4/2007 | Pan et al. | |
| 2007/0096093 A1 | 5/2007 | Bhalla et al. | |
| 2007/0182435 A1 | 8/2007 | Lui et al. | |
| 2007/0194374 A1* | 8/2007 | Bhalla .................. | H01L 29/407 257/330 |
| 2007/0221972 A1 | 9/2007 | Bhalla et al. | |
| 2008/0001219 A1 | 1/2008 | Bhalla et al. | |
| 2008/0001220 A1 | 1/2008 | Bhalla et al. | |
| 2008/0001646 A1 | 1/2008 | Lui et al. | |
| 2008/0061347 A1* | 3/2008 | Mallikararjunaswamy ................. | H01L 27/115 257/314 |
| 2008/0067584 A1 | 3/2008 | Lui et al. | |

(56) References Cited

U.S. PATENT DOCUMENTS

| | | | |
|---|---|---|---|
| 2008/0084365 A1* | 4/2008 | Takahara | G09G 3/006 345/76 |
| 2008/0173956 A1 | 7/2008 | Bhalla et al. | |
| 2008/0186048 A1 | 8/2008 | Lui et al. | |
| 2008/0265289 A1 | 10/2008 | Bhalla et al. | |
| 2008/0290367 A1 | 11/2008 | Su et al. | |
| 2008/0309382 A1 | 12/2008 | Bhalla et al. | |
| 2009/0014853 A1 | 1/2009 | Luo et al. | |
| 2009/0039456 A1 | 2/2009 | Bhalla et al. | |
| 2009/0065814 A1 | 3/2009 | Bhalla et al. | |
| 2009/0065855 A1 | 3/2009 | Bhalla et al. | |
| 2009/0065861 A1 | 3/2009 | Bhalla et al. | |
| 2009/0072301 A1 | 3/2009 | Bhalla et al. | |
| 2009/0102541 A1* | 4/2009 | Lopez | H02M 1/08 327/434 |
| 2009/0127593 A1* | 5/2009 | Bhalla | H01L 29/1095 257/263 |
| 2009/0128223 A1 | 5/2009 | Lui et al. | |
| 2009/0218890 A1 | 9/2009 | Lui et al. | |
| 2009/0219044 A1 | 9/2009 | Bhalla et al. | |
| 2009/0224316 A1 | 9/2009 | Bhalla et al. | |
| 2010/0006929 A1* | 1/2010 | Andou | H01L 29/0623 257/330 |
| 2010/0090276 A1 | 4/2010 | Bhalla et al. | |
| 2010/0148246 A1 | 6/2010 | Bhalla et al. | |
| 2010/0155876 A1 | 6/2010 | Pan et al. | |
| 2010/0258897 A1 | 10/2010 | Lui et al. | |
| 2010/0330767 A1 | 12/2010 | Lui et al. | |
| 2011/0042724 A1 | 2/2011 | Bhalla et al. | |
| 2011/0042727 A1 | 2/2011 | Pan et al. | |
| 2011/0049580 A1 | 3/2011 | Lui et al. | |
| 2011/0097885 A1 | 4/2011 | Bhalla et al. | |
| 2011/0204440 A1 | 8/2011 | Bhalla et al. | |
| 2011/0207276 A1 | 8/2011 | Bhalla et al. | |
| 2011/0221005 A1 | 9/2011 | Luo et al. | |
| 2011/0233666 A1 | 9/2011 | Lui et al. | |
| 2011/0233667 A1 | 9/2011 | Tai et al. | |
| 2012/0007206 A1 | 1/2012 | Bhalla et al. | |
| 2012/0018793 A1 | 1/2012 | Bhalla et al. | |
| 2012/0025298 A1* | 2/2012 | Ho | H01L 23/3114 257/329 |
| 2012/0025301 A1 | 2/2012 | Lui et al. | |
| 2012/0049834 A1* | 3/2012 | Pommerenke | H02M 1/34 323/311 |
| 2012/0068262 A1 | 3/2012 | Pan | |
| 2012/0074896 A1 | 3/2012 | Lui et al. | |
| 2012/0080751 A1 | 4/2012 | Bhalla et al. | |
| 2012/0132988 A1 | 5/2012 | Lui et al. | |
| 2012/0146090 A1 | 6/2012 | Lui et al. | |
| 2012/0193676 A1 | 8/2012 | Bobde et al. | |
| 2012/0200281 A1* | 8/2012 | Herbsommer | H01L 24/41 323/311 |
| 2012/0248530 A1 | 10/2012 | Lui et al. | |
| 2012/0249107 A1* | 10/2012 | Cowley | H02M 3/1584 323/290 |
| 2012/0306043 A1 | 12/2012 | Pan et al. | |
| 2012/0306044 A1 | 12/2012 | Bobde et al. | |
| 2012/0329225 A1 | 12/2012 | Bhalla et al. | |
| 2013/0001683 A1 | 1/2013 | Pan et al. | |
| 2013/0009242 A1 | 1/2013 | Bhalla et al. | |
| 2013/0015550 A1 | 1/2013 | Bhalla et al. | |
| 2013/0038304 A1* | 2/2013 | Roig Guitart | H03K 17/06 323/282 |
| 2013/0043527 A1 | 2/2013 | Lui et al. | |
| 2013/0093001 A1 | 4/2013 | Bhalla et al. | |
| 2013/0105886 A1 | 5/2013 | Lui et al. | |
| 2013/0119460 A1* | 5/2013 | Lin | H01L 29/66348 257/330 |
| 2013/0126966 A1 | 5/2013 | Lui et al. | |
| 2013/0175612 A1 | 7/2013 | Tai et al. | |
| 2013/0200451 A1* | 8/2013 | Yilmaz | H01L 29/4236 257/331 |
| 2013/0203224 A1 | 8/2013 | Pan et al. | |
| 2013/0203225 A1 | 8/2013 | Bhalla et al. | |
| 2013/0224919 A1 | 8/2013 | Ding et al. | |
| 2013/0280870 A1 | 10/2013 | Bhalla et al. | |
| 2013/0325380 A1* | 12/2013 | Behnke, II | A61B 18/1233 702/64 |
| 2013/0334599 A1* | 12/2013 | Pan | H01L 29/7803 257/337 |
| 2014/0048846 A1 | 2/2014 | Lui et al. | |
| 2014/0054687 A1 | 2/2014 | Pan et al. | |
| 2014/0085760 A1 | 3/2014 | Lui | |
| 2014/0138767 A1 | 5/2014 | Lui et al. | |
| 2014/0151790 A1 | 6/2014 | Lui et al. | |
| 2014/0175540 A1 | 6/2014 | Bobde et al. | |
| 2014/0179074 A1 | 6/2014 | Pan et al. | |
| 2014/0225187 A1 | 8/2014 | Bhalla et al. | |
| 2014/0225190 A1* | 8/2014 | Mallikarjunaswamy | H01L 21/823807 257/334 |
| 2014/0235024 A1 | 8/2014 | Pan et al. | |
| 2014/0239382 A1 | 8/2014 | Bobde et al. | |
| 2014/0239388 A1 | 8/2014 | Lee et al. | |
| 2014/0252494 A1 | 9/2014 | Lui et al. | |
| 2014/0264569 A1* | 9/2014 | Yedinak | H01L 21/02104 257/330 |
| 2014/0264571 A1 | 9/2014 | Lui et al. | |
| 2014/0319605 A1 | 10/2014 | Yilmaz et al. | |
| 2014/0319606 A1 | 10/2014 | Bhalla et al. | |
| 2014/0332882 A1 | 11/2014 | Lui et al. | |
| 2014/0339630 A1 | 11/2014 | Yilmaz et al. | |
| 2014/0357030 A1 | 12/2014 | Bhalla et al. | |
| 2015/0060936 A1 | 3/2015 | Ding et al. | |
| 2015/0097232 A1 | 4/2015 | Tai et al. | |
| 2015/0129956 A1 | 5/2015 | Lui | |
| 2015/0137225 A1 | 5/2015 | Lui et al. | |
| 2015/0137227 A1 | 5/2015 | Bobde et al. | |
| 2015/0145037 A1 | 5/2015 | Lee et al. | |
| 2015/0162777 A1 | 6/2015 | Lui et al. | |
| 2015/0171192 A1 | 6/2015 | Pan | |
| 2015/0171201 A1 | 6/2015 | Lui et al. | |
| 2015/0206943 A1 | 7/2015 | Bobde et al. | |
| 2015/0270387 A1* | 9/2015 | Kumada | H01L 29/7397 257/140 |
| 2015/0295495 A1 | 10/2015 | Lui et al. | |
| 2015/0311295 A1 | 10/2015 | Lee et al. | |
| 2015/0333174 A1 | 11/2015 | Lee et al. | |
| 2015/0372133 A1 | 12/2015 | Lui | |
| 2015/0380544 A1 | 12/2015 | Yilmaz et al. | |
| 2016/0064551 A1 | 3/2016 | Lee et al. | |
| 2016/0087093 A1 | 3/2016 | Bhalla et al. | |
| 2016/0099308 A1 | 4/2016 | Lui et al. | |
| 2016/0118380 A1 | 4/2016 | Lui et al. | |
| 2016/0141411 A1 | 5/2016 | Bobde et al. | |
| 2016/0172482 A1 | 6/2016 | Bobde et al. | |
| 2016/0181391 A1 | 6/2016 | Bobde et al. | |
| 2016/0190283 A1 | 6/2016 | Pan et al. | |
| 2016/0191048 A1 | 6/2016 | Lui et al. | |
| 2016/0247899 A1 | 8/2016 | Bhalla et al. | |
| 2016/0254347 A1 | 9/2016 | Tsuchiko et al. | |
| 2016/0300917 A1 | 10/2016 | Xue et al. | |
| 2016/0315053 A1 | 10/2016 | Pan et al. | |
| 2016/0322469 A1 | 11/2016 | Bhalla et al. | |
| 2016/0329426 A1 | 11/2016 | Lee et al. | |
| 2017/0069727 A1* | 3/2017 | Blanchard | H01L 29/7813 |
| 2017/0373185 A1* | 12/2017 | Yilmaz | H01L 29/4236 |
| 2018/0026639 A1* | 1/2018 | Aurola | H01L 27/0207 326/81 |
| 2018/0108652 A1* | 4/2018 | Pan | H01L 21/30604 |

OTHER PUBLICATIONS

Notice of Allowance for U.S. Appl. No. 15/294,518, dated Jun. 20, 2018.

\* cited by examiner

600

US 10,256,236 B2

FORMING SWITCH CIRCUIT WITH CONTROLLABLE PHASE NODE RINGING

CLAIM OF PRIORITY

This application is a divisional of U.S. patent application Ser. No. 15/294,518 filed Oct. 14, 2016, which was published as U.S. Patent Application Publication Number 20180108652, the entire contents of both of which are incorporated herein by reference.

FIELD OF THE DISCLOSURE

This disclosure relates to integrated circuits and more specifically to integrated circuit devices having metal-oxide-semiconductor field effect transistors (MOSFETs).

BACKGROUND OF INVENTION

Integrated circuits, such as microprocessors and memory devices, contain many MOSFET transistors on each device, providing the basic switching functions required to implement logic gates and/or data storage. In one example, a DC-to-DC power converter, such as a buck converter, usually employs MOSFETs as its switching devices. In particular, a buck converter widely used throughout the industry converts a higher input voltage into a lower output voltage. A synchronous buck converter includes a pair of switching devices coupled in series across the input voltage source. The switching devices are typically MOSFETs. FIG. 1 shows a conventional buck converter which consists a high-side and a low-side switch. The high-side switch 102 is coupled to the voltage supply (Vin) and the low-side switch 104 is connected to ground. An output filter typically including an inductor (L) and a capacitor (Cout) is connected to a junction (i.e., phase node or switch node) 105 formed by the pair of switches 102 and 104 for providing the output voltage to a load. A controller 110 drives the switches to connect the output filter to the voltage supply or to ground to maintain the output voltage at a predetermined level.

One issue in a synchronous buck converter design is voltage overshoots and ringing on the phase node. Due to the growing demand for higher performance devices, the high side MOSFET's switching speed are expected to be faster. The faster the switching speed, the faster the voltage transition of the phase node. The fast voltage transition may cause the inadvertent turn-on of the low-side switch, resulting in a converter malfunction and reducing efficient. In addition, it may cause the phase node ringing as the magnitude of the ringing is a function of the high side MOSFET's switching speed. The phase node voltage spikes can induce malfunction or undesired stress of the power switches.

A number of techniques are used to control phase node ringing. As shown in FIG. 1, the boost resistor RBOOT and the high side gate resistor RGH have been included in the synchronous buck converter of FIG. 1 for control of the phase node ringing phenomenon. Specifically, the boost resistor RBOOT can slow down the turn-on of the high side MOSFET without affecting the turn-off. In addition, the high side gate resistor RGH in series with the gate can increase both the turn-on and turn-off times of the high-side MOSFET, which controls ringing on the rise and fall of the phase node. Another proposal is to integrate a Schottky diode in the low-side switch to reduce recovery charge, thus avoiding voltage spikes at phase node. It is desirable to design a switch circuit that can properly control the phase node ringing of a synchronous buck converter.

It is within this context that embodiments of the present invention arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

Figure 1:
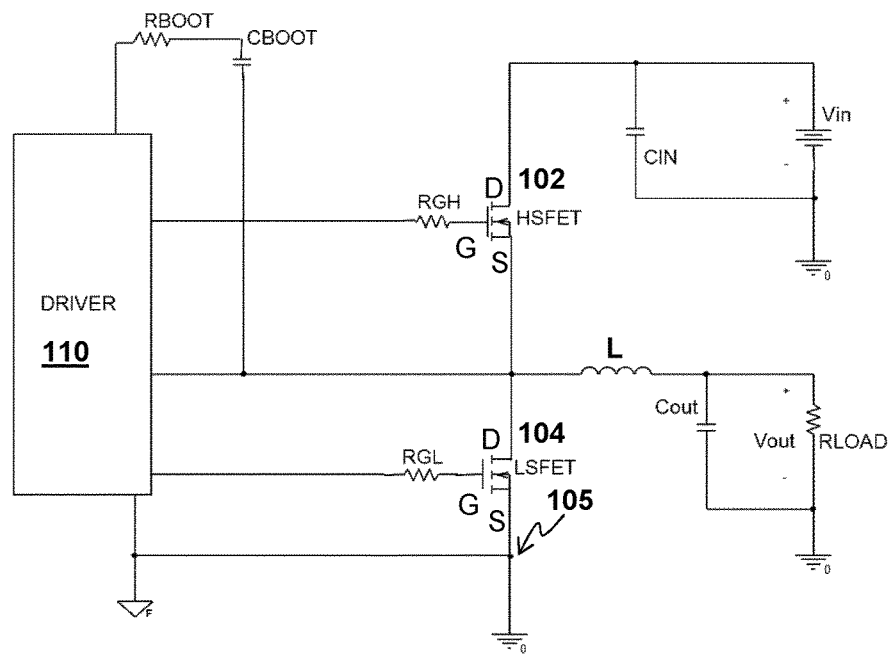
FIG. 1 is a schematic diagram of a conventional buck converter.

Aspects of the present disclosure propose to replace the conventional low-side MOSFET switch with a switch circuit that allows a synchronous buck converter to have a smooth phase node waveform. Aspects of the present disclosure include a switch circuit having a main MOS transistor and a secondary MOS transistor connected in parallel. The main MOS transistor is characterized by a first reverse gate-to-drain capacitance ($C_{rss}$) and a first threshold voltage. The secondary MOS transistor is characterized by a second $C_{rss}$ and a second threshold voltage. In some embodiments, the phase node voltage ringing of a synchronous buck converter using such a switch circuit can be reduced by increasing the $C_{rss}$ of the secondary MOS transistor such that the second $C_{rss}$ is greater than the first $C_{rss}$. In some embodiments, the phase node voltage ringing can be further reduced by lowering the threshold voltage of the secondary MOS transistor such that the second threshold voltage is lower than the first threshold voltage. In some other embodiments, the phase node voltage ringing can be reduced by increasing the $C_{rss}$ of the secondary MOS transistor and lowing the threshold voltage of the secondary MOS transistor such that the second $C_{rss}$ is greater than the first $C_{rss}$ and the second threshold voltage is lower than the first threshold voltage.

Reverse Source-to-Source Capacitance ($C_{rss}$)

One approach to smooth the phase node waveform of a synchronous buck converter is to replace the conventional single low-side MOSFET with a main MOS transistor and a parallel secondary MOS transistor having a higher $C_{rss}$ comparing to that of the main MOS transistor. FIG. 2 illustrates a switch circuit 200 that may be used as, e.g., the low-side switch 104 in the buck converter shown FIG. 1, according to aspects of the present disclosure. The switch circuit 200 has a first terminal, e.g., a drain, D, a second terminal, e.g., a source, S and a control terminal, e.g., a gate, G. The switch circuit 200 has two MOSFETs, a main MOS transistor 210 having regular $C_{rss}$ and a secondary MOS transistor 220 having high $C_{rss}$ connected in parallel between the first terminal D and the second terminal S. The main and the secondary MOS transistors 210 and 220 have respective gate terminals coupled to the control terminal G to receive a control signal to turn the main and the secondary MOS transistors 210, 220 on or off.

The main MOS transistor 210 and the secondary MOS transistor 220 are of the same conductivity. The main MOS transistor 210 and the secondary MOS transistor 220 are formed in a common active device area of a common semiconductor substrate. Specifically, each of the main MOS transistor 210 and the secondary MOS transistor 220 comprises one or more trench transistors. Each of the trench transistors has a gate terminal formed in a trench in a semiconductor layer on the common semiconductor substrate, a body region formed in the semiconductor layer and a source region formed proximate the trench.

An area of the main MOS transistor 210 is a regular $C_{rss}$ area, and an area of the secondary MOS transistor 220 is a high $C_{rss}$ area. The ratio of the high $C_{rss}$ area to the regular $Cr_{ss}$ area affects the phase node peak voltage. The higher area ratio results in a lower phase node peak voltage, and thus smoothing the phase node waveform. Alternatively, the higher the $C_{rss}$ in the high $C_{rss}$ area, the smaller the area ratio needed to get the desired effect of reduced phase node ringing. The ratio may be pre-determined according to the desired reduction on phase node peak voltage. By way of example and not by way of limitation, the high $C_{rss}$ area may be between 0.1% and 15% of a total area of the common active device area.

Figure 3:
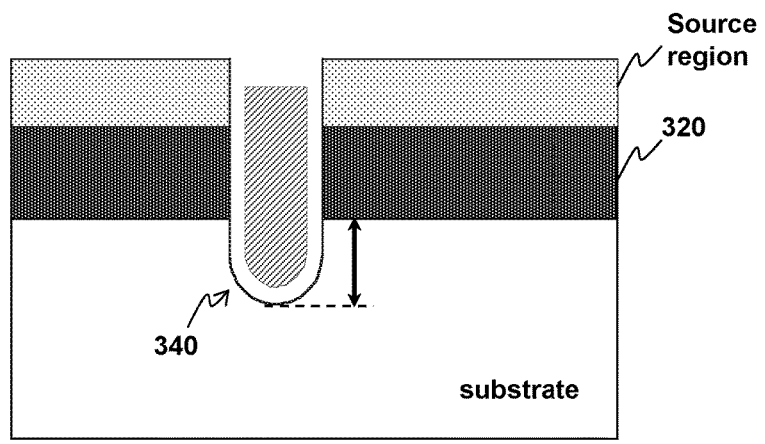
FIG. 3 is a cross-sectional schematic diagram of portions of a conventional trench MOSFET.

FIG. 3 shows a cross-sectional schematic diagram of portions of a conventional trench MOSFET. As well known in the industry, $C_{rss}$ is basically proportional to the depth between the bottom of the body region 320 and the bottom of the gate trench 340 as indicated in FIG. 3. Thus, one approach to increase $C_{rss}$ is to increase the trench depth for the gate trenches 340 in the high $C_{rss}$ area. Another approach is to lower the depth of the body region 320 in the high $C_{rss}$ area of the active region. It should be noted that, in some embodiments, the $C_{rss}$ can be increased by having a deeper gate trenches in conjunction with a shallower body region in the high $C_{rss}$ area.

Figure 3A:
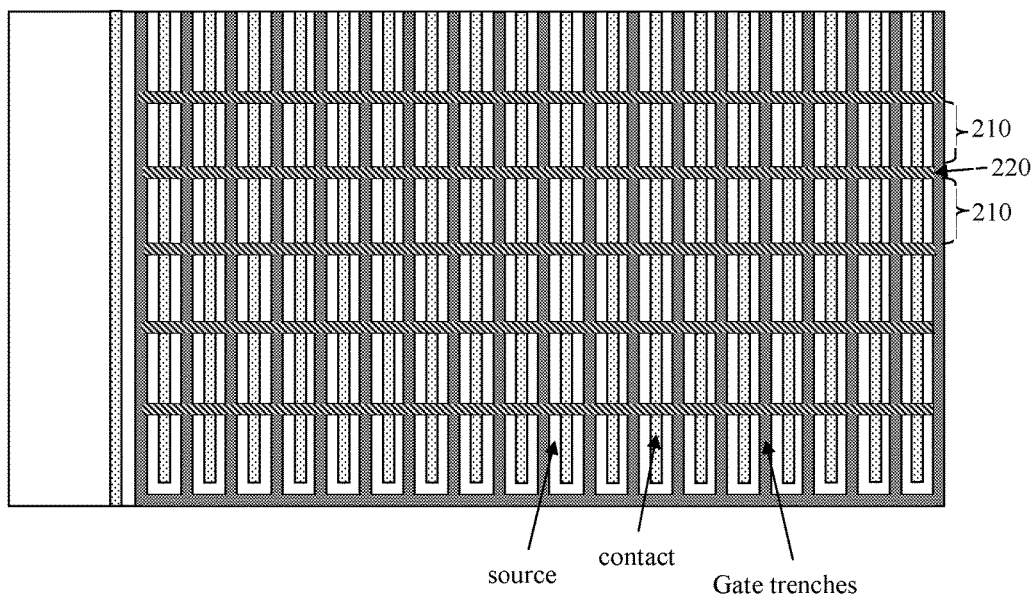
FIG. 3A is an example layout of a switch circuit of FIG. 2.

Preferably the area of the secondary MOS transistor 220 should be evenly distributed through the area of the main MOS transistor 210. FIG. 3A is an example layout of the switch circuit 200 formed on a semiconductor substrate including the main MOS transistor 210 and the secondary MOS transistor 220 without showing a top source metal layer. The gate trenches are in parallel stripes with source regions disposed on top of the substrate between the parallel gate trenches with contact openings opened through the source regions. Segments of the secondary MOS transistor 220 are disposed along each stripe MOS structure forming stripes of secondary MOS transistor 220 in a direction perpendicular to the gate trench stripe direction. Alternatively, an entire length of certain gate trenches may be selected to form a stripe of the secondary MOS transistor 220 in the direction of the gate trench stripe.

First Embodiment

FIGS. 4A-4J are cross-sectional views illustrating the fabrication process for forming a switch circuit of FIG. 2 having the gate trench for each trench transistor of the secondary MOS transistor 220 deeper in depth in the semiconductor layer than the gate trenches of the trench transistors of the main MOS transistor 210.

Figure 4A:
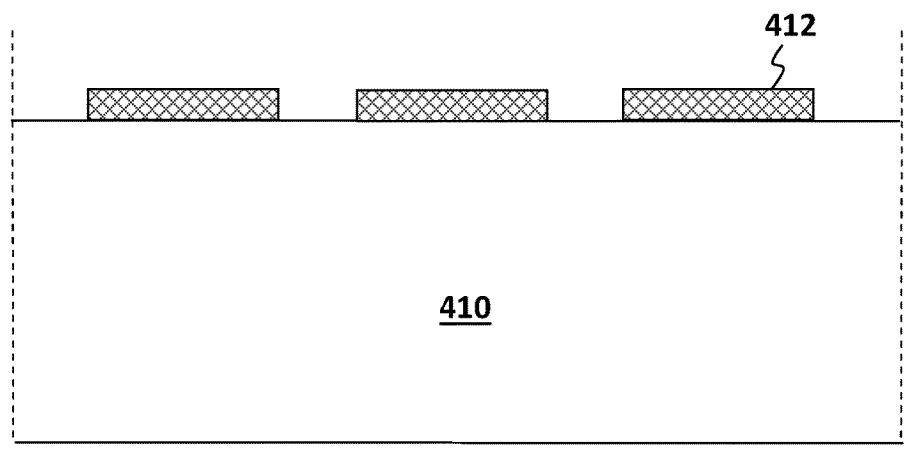
FIGS. 4A-4J are cross-sectional views illustrating the fabrication process for forming a switch circuit of FIG. 2 in one embodiment of present disclosure.
Figure 4B:
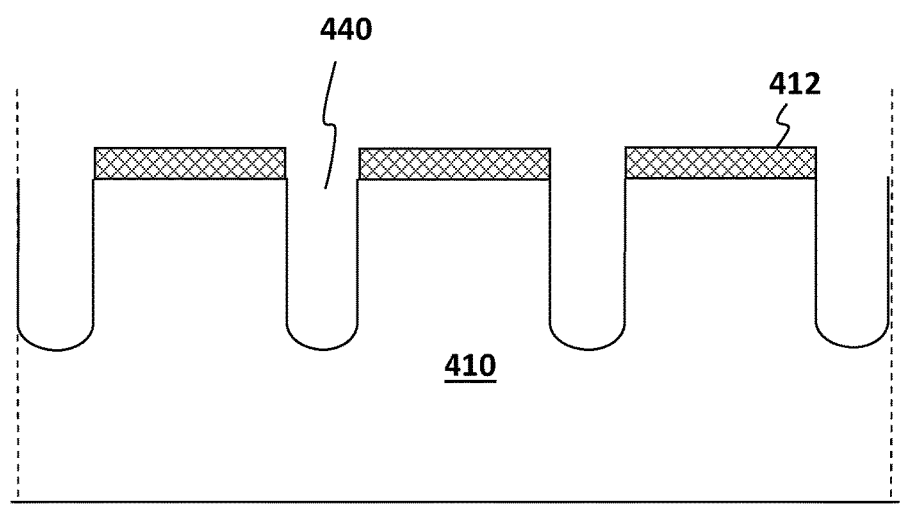

Referring to FIG. 4A, the process uses a semiconductor substrate 410 of a first conductivity as a starting material. In some embodiments, the substrate 410 may include an N-type epitaxial layer on top of a heavily doped N type (N+) silicon wafer. A mask 412 applied on the substrate 410 includes openings to define locations of a plurality of gate trenches for the trench transistors of the main MOS transistor 210 and the secondary MOS transistor 220. In FIG. 4B, an etching process is performed and the corresponding portions of the underlying substrate 410 are etched down to form a plurality of the gate trenches 440.

Figure 4C:
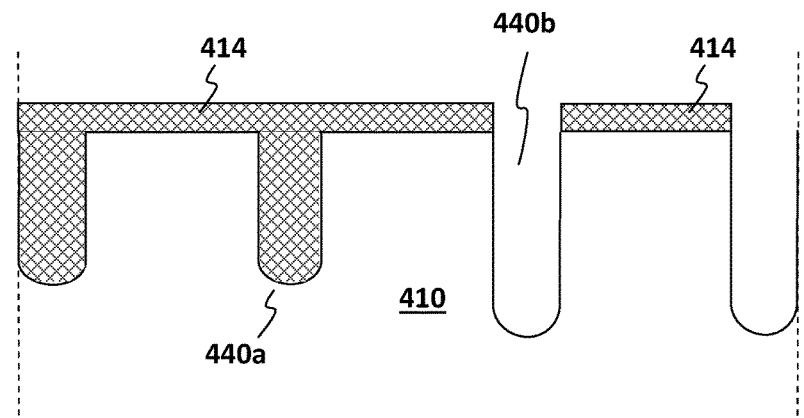
Figure 4C:
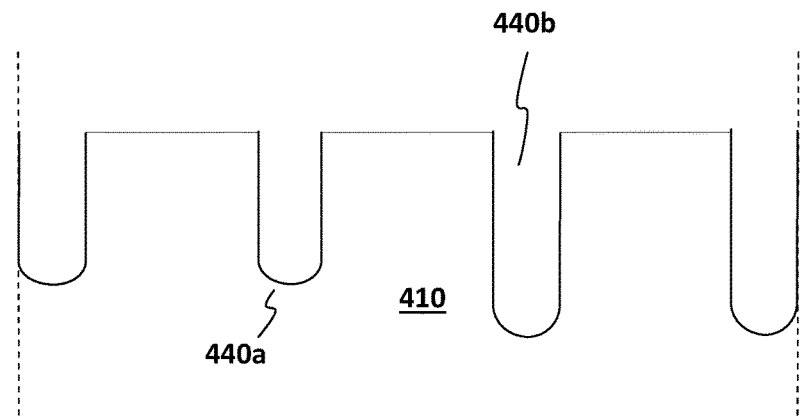

Another mask 414 is applied to mask the gate trenches 440a in the regular $C_{rss}$ area (i.e., the gate trenches for the trench transistors of the main MOS transistor 210) and uncover the gate trenches 440b in the high $C_{rss}$ area (i.e., the gate trenches for the trench transistors of the secondary MOS transistor 220). Another etch process is performed to make the gate trenches 440b deeper as shown in FIG. 4C. The mask 414 may then be removed, as shown in FIG. 4C'. Subsequent processing may proceed as described below with respect to FIGS. 4D-4J.

Figure 4D:
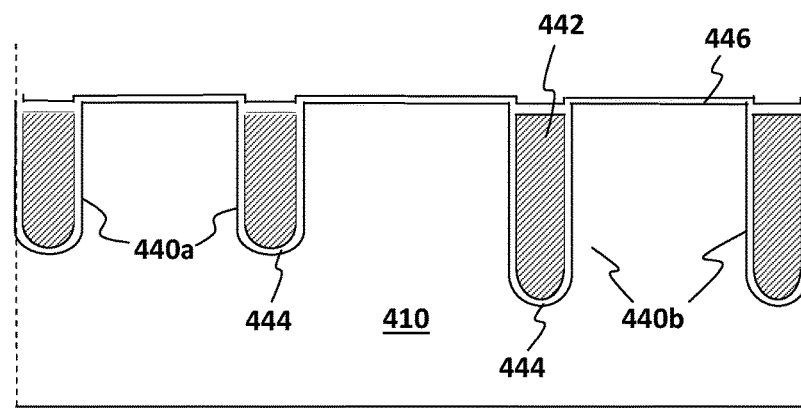
Figure 4E:
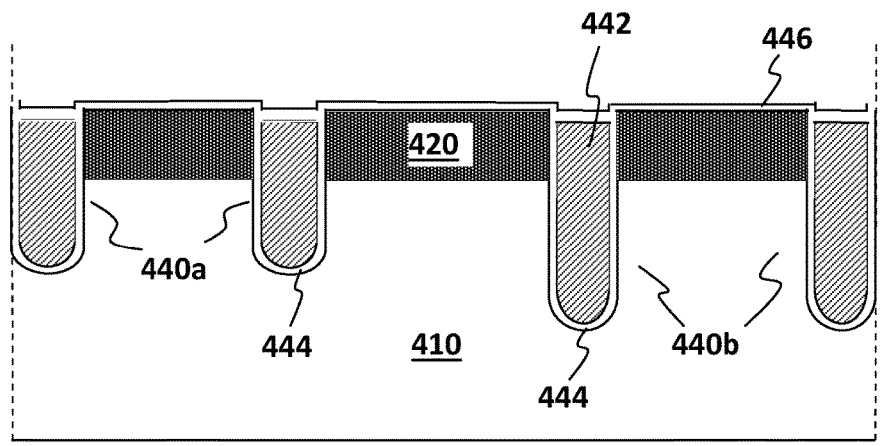
Figure 4F:
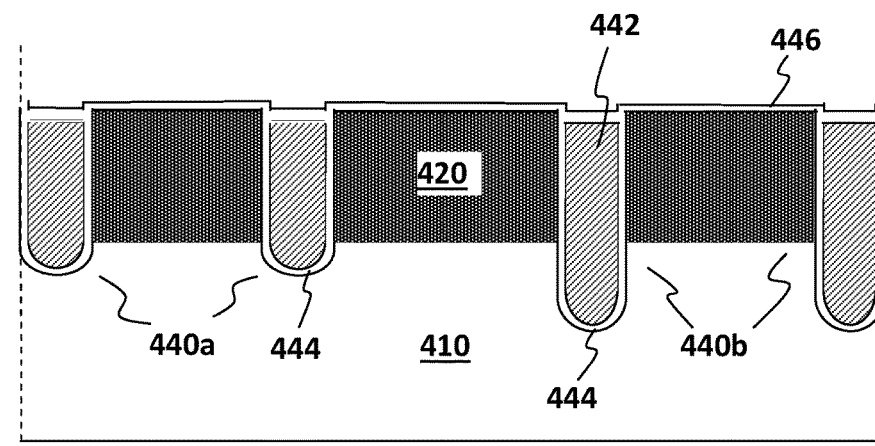
Figure 4G:
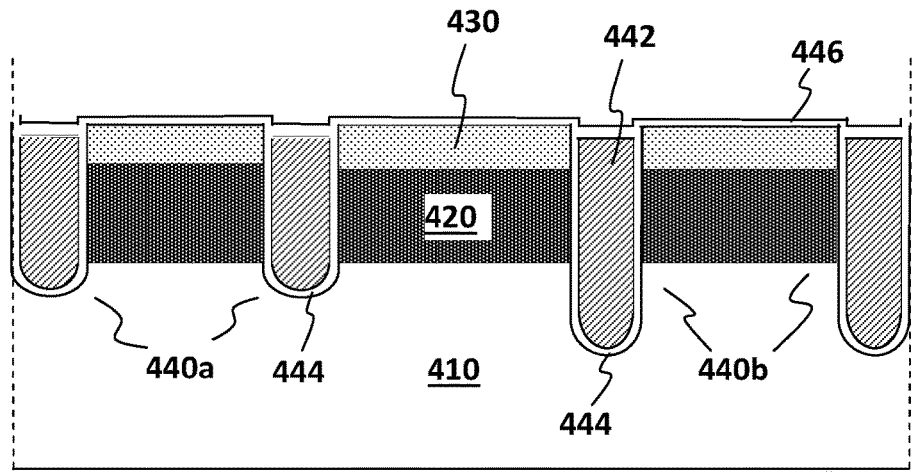
Figure 4H:
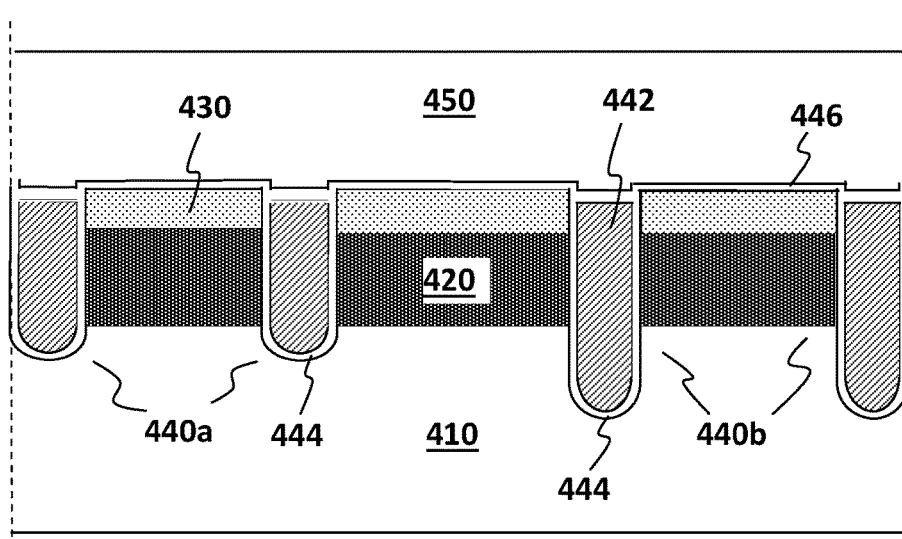
Figure 4I:
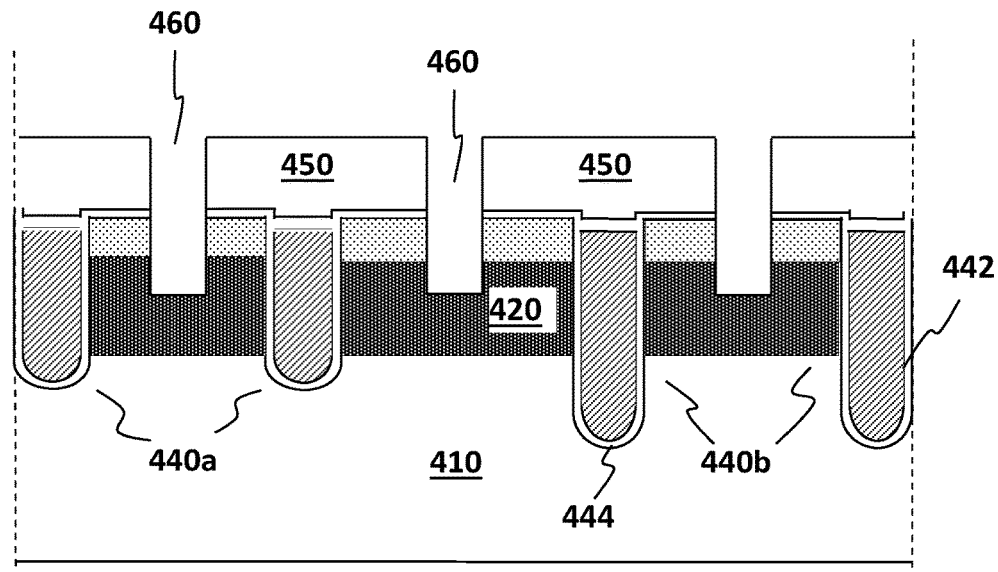
Figure 4J:
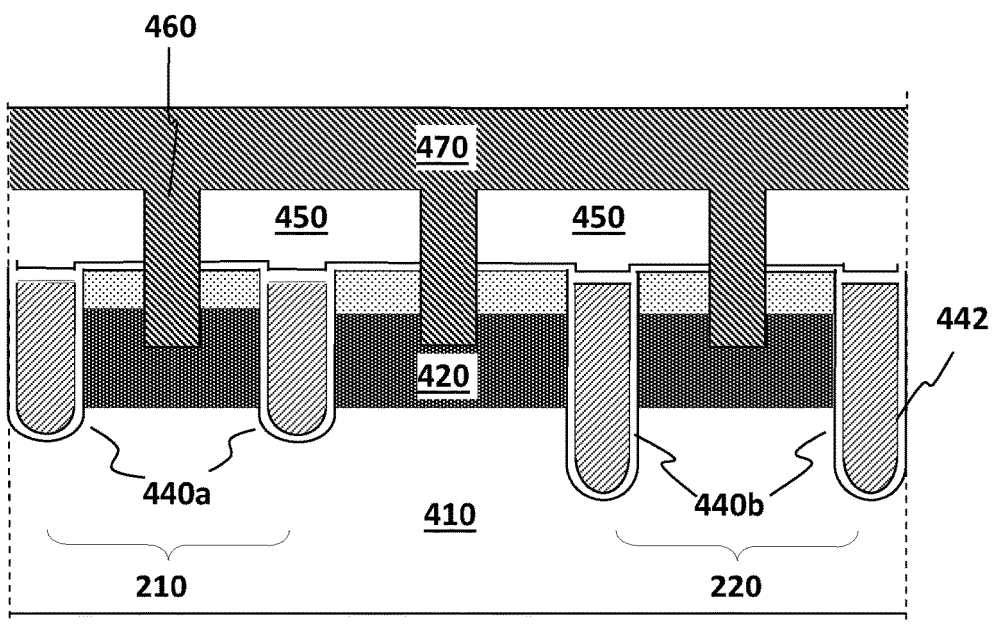
Figure 4K:
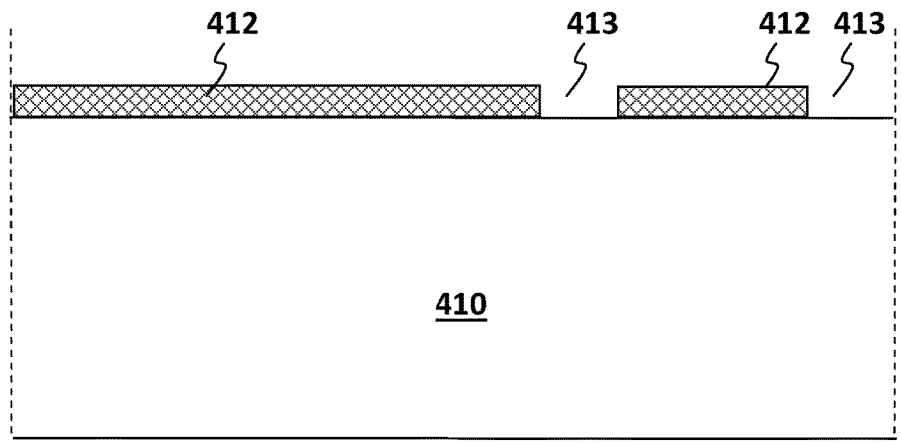
FIGS. 4K-4N are cross-sectional views illustrating the fabrication process for forming a switch circuit of FIG. 2 in one embodiment of present disclosure.
Figure 4L:
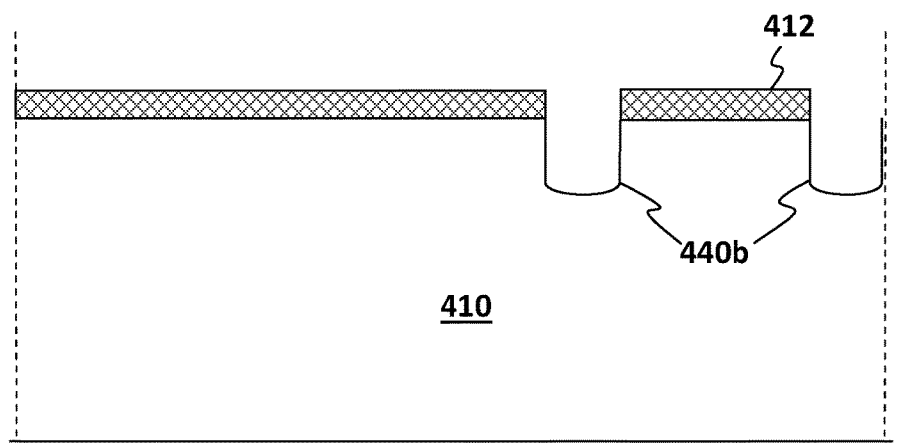
Figure 4M:
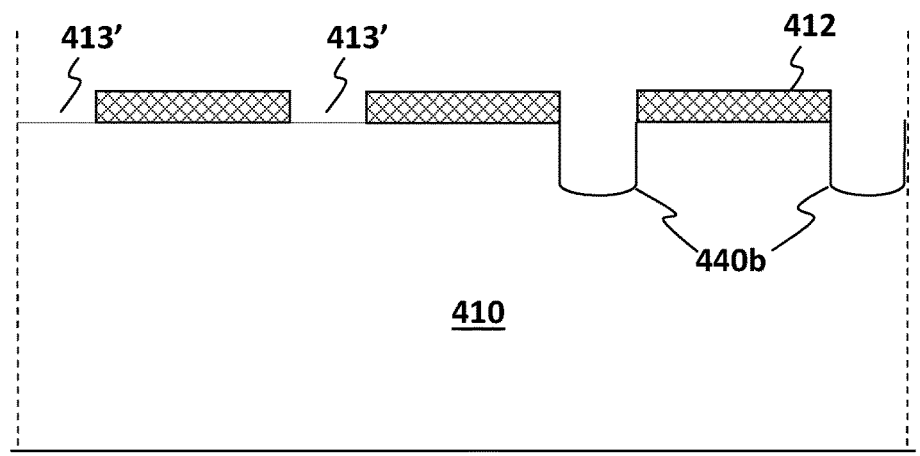
Figure 4N:
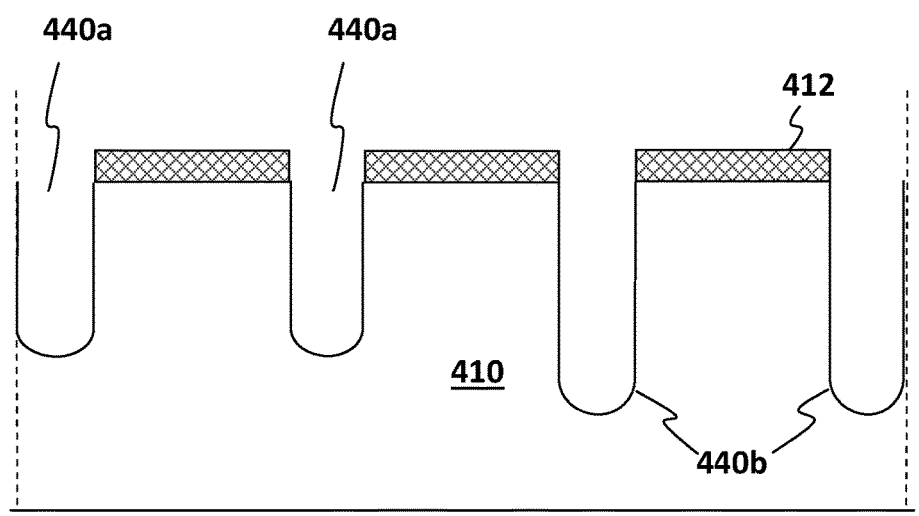

In an alternative implementation, shown in FIGS. 4K-4N, trenches of two different depths may be formed by modifying a mask between two etch processes. Specifically, as shown in FIG. 4K, a mask 412 having a first set of openings 413 is applied on the substrate 410. A first etching process is performed, as shown in FIG. 4L to etch gate trenches 440b into the substrate to an initial depth. Additional openings 413' are then formed in the mask 412, as shown in FIG. 4M. Alternatively, the mask 412 may be removed and a second mask may be formed having openings corresponding to the original openings 413 and the additional openings 413'. A second etch process etches the substrate 410 through the additional openings 413' to form gate trenches 440a while the second etch process also etches the substrate through the original openings 413 to deepen the trenches 440b. The mask 412 may then be removed and subsequent processing may proceed as described below with respect to FIGS. 4D-4J.

Specifically, after the trenches 440a, 440b have been formed to their respective depths and the masks have been removed, a sacrificial oxide layer (not shown) may be grown and then removed to improve the silicon surface. Referring to FIG. 4D, an insulating layer (e.g., gate oxide) 444 is then formed along the inner surface of the gate trenches 440a and 440b. A conductive material is then deposited over the gate oxide layer 444 with an etch back to form the gate electrode 442. In some embodiments, the conductive material can be in-situ doped or undoped polysilicon. A dielectric layer 446 may be formed above the trenches to cap the trenches and above the substrate 410 as an implant buffer layer.

Referring to FIG. 4E, a blanket body implant is performed to form body regions 420. The dopant ions are of the opposite conductivity type to the doping of the substrate 410. In some embodiments, the dopant ions can be Boron ions for an N-channel device. In some embodiments, Phosphorous or Arsenic ions can be used for P-channel devices. Heat is then applied to activate dopant atoms and drive dopant diffusion to form the body regions 420 as shown in FIG. 4F.

Referring to FIG. 4G, source implant and diffusion are performed to form source regions 430 in the top surface of the substrate 410. The dopant ions are of the same conductivity type to the doping of the substrate 410. In some embodiments, Arsenic ions can be implanted for an N-channel device. Alternatively, Boron ion can be implanted for a P-channel device.

Subsequently, a planarized dielectric layer 450 is deposited over the substrate 410 as shown in FIG. 4H. In some embodiments, the dielectric layer 450 is formed by a low temperature oxidation process with material of Borophosphorosilicate Glass (BPSG).

A contact photoresist (not shown) is then applied on the dielectric layer 450 with a pattern that has an opening at the locations of contact trenches. An etch process is performed to remove the uncovered portions of the dielectric layer 450 and form contact trenches 460 through the source region 430 into the body region 420 as shown in FIG. 4I A metal layer 470 is then deposited to fill the contact openings and to interconnect all the source regions to form the main MOS transistor 210 and secondary MOST transistor 220 connected in parallel.

Second Embodiment

FIGS. 5A-5J are cross-sectional views illustrating the fabrication process for forming a switch circuit of FIG. 2 by making the body region for each trench transistor of the secondary MOS transistors 220 shallower in depth comparing to the body regions for the trench transistors of the main MOS transistors 210.

Figure 5A:
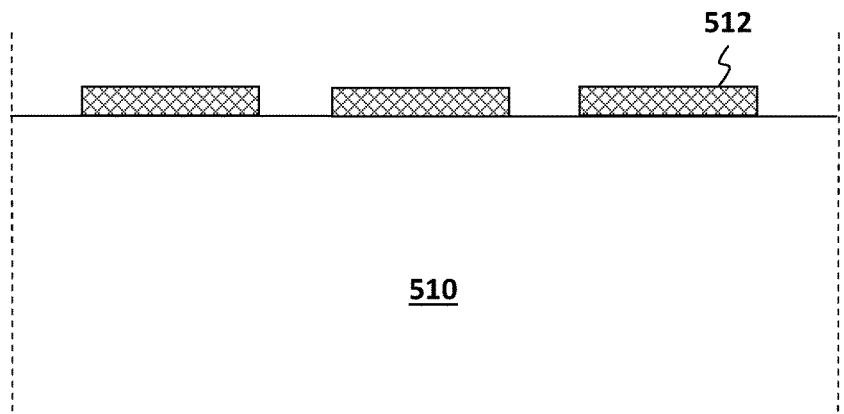
FIGS. 5A-5J are cross-sectional views illustrating the fabrication process for forming a switch circuit of FIG. 2 in an alternative embodiment of present disclosure.
Figure 5B:
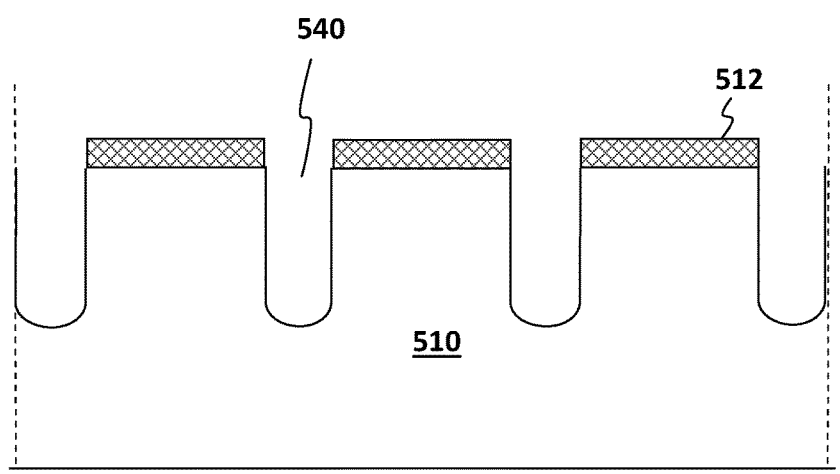
Figure 5B:
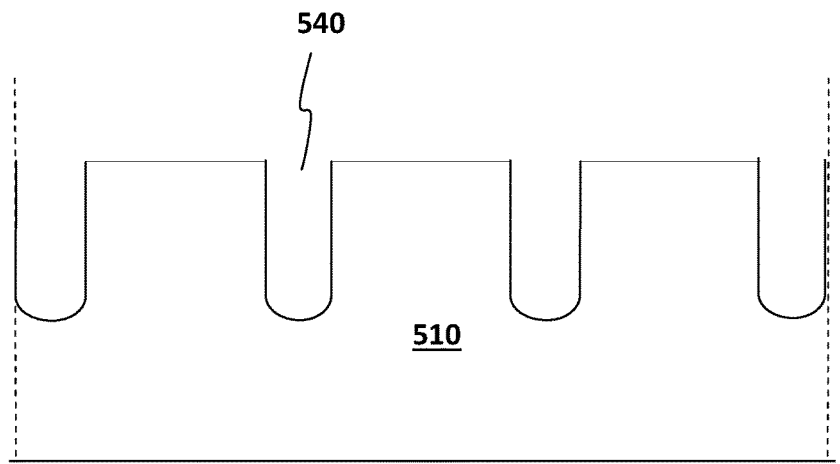

Referring to FIG. 5A, the process uses a semiconductor substrate 510 of a first conductivity as a starting material. In some embodiments, the substrate 510 may include an N-type epitaxial layer on top of a heavily doped N type (N+) silicon wafer. A mask 512 applied on the substrate 510 includes openings to define locations of the gate trenches for the trench transistors of the main MOS transistor 210 and the secondary MOS transistor 220. As shown in FIG. 5B, an etching process is performed and the corresponding portions of the underlying substrate 510 are etched down to form a plurality of the gate trenches 540. The mask 512 may then be removed, as shown in FIG. 5B'.

Figure 5C:
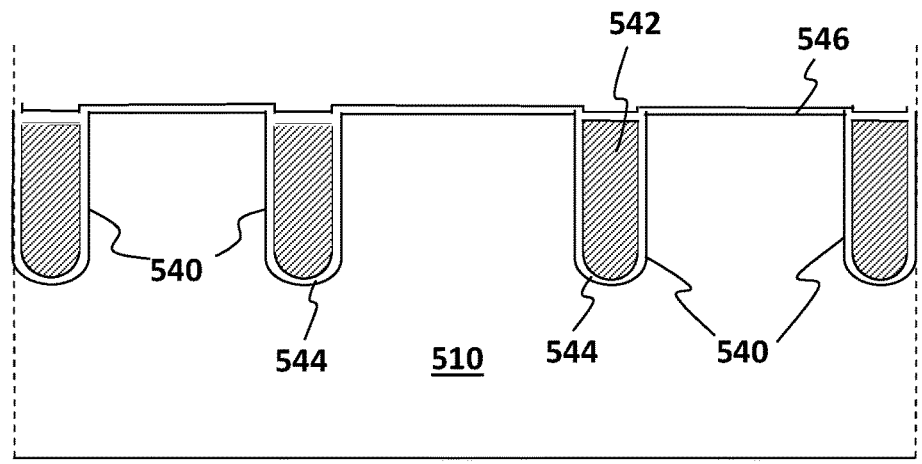

Next, a sacrificial oxide layer (not shown) may be grown and then removed to improve the silicon surface. An insulating layer (e.g., gate oxide) 544 is then formed along the inner surface of the gate trenches 540. A conductive material is then deposited over the gate oxide layer 544 with an etch back to form the gate electrode 542. In some embodiments, the conductive material can be in-situ doped or undoped polysilicon. A dielectric layer 546 may be formed above the trenches to cap the trenches and above the substrate 510 as an implant buffer layer as shown in FIG. 5C.

Figure 5D:
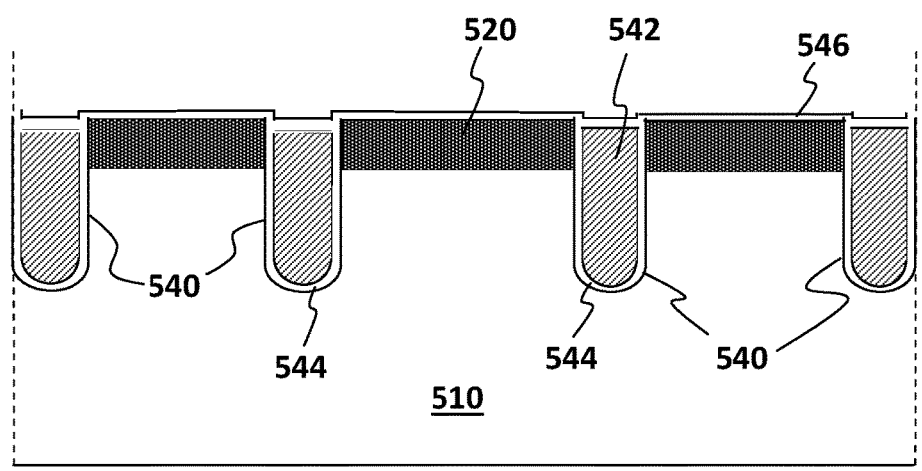
Figure 5E:
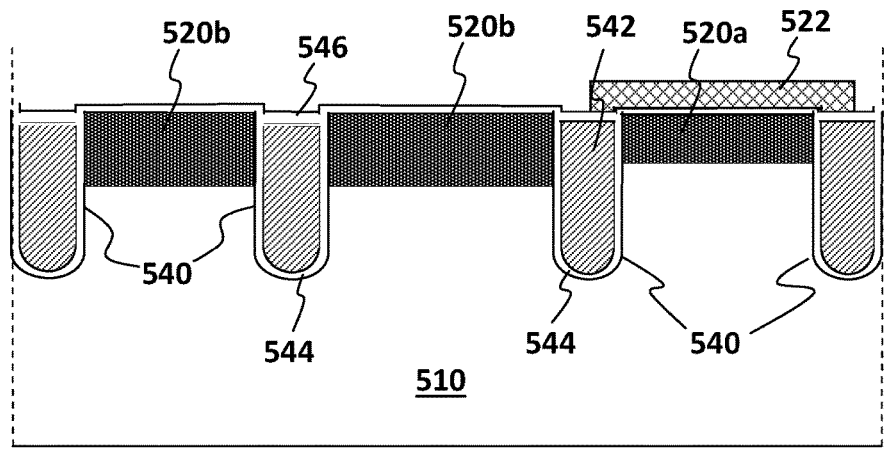
Figure 5F:
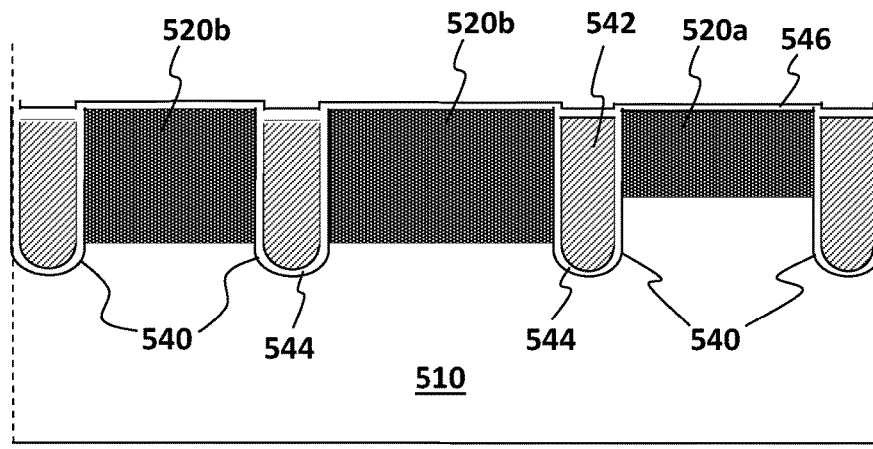

Referring to FIG. 5D, a first blanket body implant with a lower energy is performed to form body regions 520. The dopant ions are of the opposite conductivity type to the doping of the substrate 510. In some embodiments, the dopant ions can be Boron ions for an N-channel device. In some embodiments, Phosphorous or Arsenic ions can be used for P-channel devices. In some embodiments, the dopant ions are implanted into the body regions at a dose of, for example, Boron ions may be implanted to a dose of, e.g., about 1e13 cm$^{-2}$ and an energy of, for example about 100 KeV. After the first low-energy body implant, selected body regions 520a corresponding to the high $C_{rss}$ area (i.e., the body regions for the trench transistors of the secondary MOS transistors 220) are protected by an implant mask 522. Another body implant at higher energy is performed in FIG. 5E though openings in the mask. In other words, the dopant ions are only implanted into the body regions 520b in the regular $C_{rss}$ area (i.e., the body regions for the trench transistors of the main MOS transistor 210) in the second body implant. As a result, the body region 520b is deeper in depth into the substrate 510 comparing to the body region 520a in the high $C_{rss}$ area. In some embodiments, the second body implant the dopant (e.g., Boron) ions into the body regions 520b at a dose of, for example, about 8e12 cm$^{-2}$ and an energy of, for example about 150 KeV. Heat is then applied to activate dopant atoms and drive dopant diffusion to form the body regions 520a and 520b as shown in FIG. 5F.

Figure 5G:
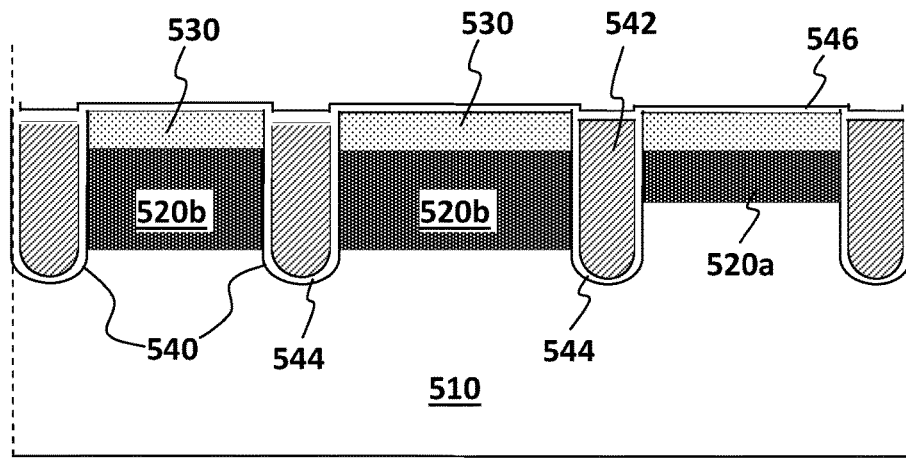

Referring to FIG. 5G, source implant is performed to form source regions 530 in the top surface of the substrate 510. The dopant ions are of the same conductivity type to the doping of the substrate 510. In some embodiments, Arsenic ions can be implanted for an N-channel device. Alternatively, Boron ion can be implanted for a P-channel device.

Figure 5H:
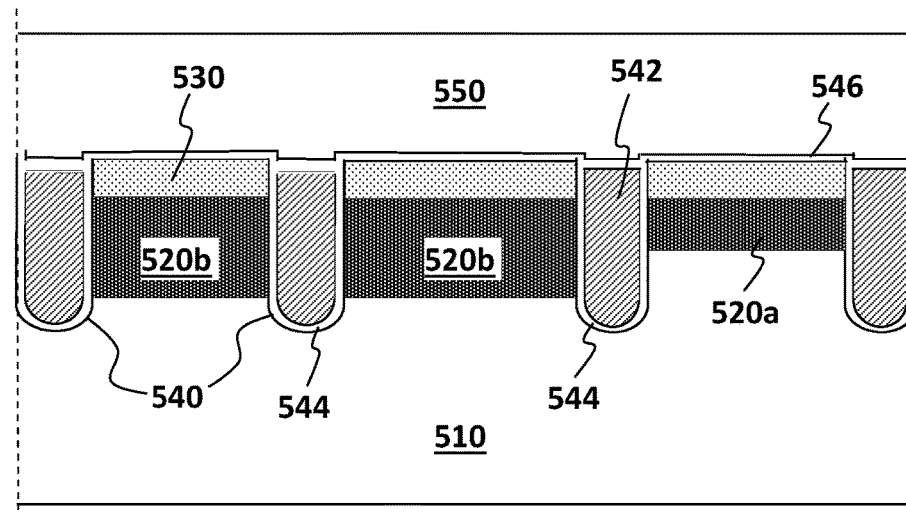

Subsequently, a planarized dielectric layer 550 is deposited over the substrate 510 as shown in FIG. 5H. In some embodiments, the dielectric layer 550 is formed by a low temperature oxidation process with material of Borophosphorosilicate Glass (BPSG).

Figure 5I:
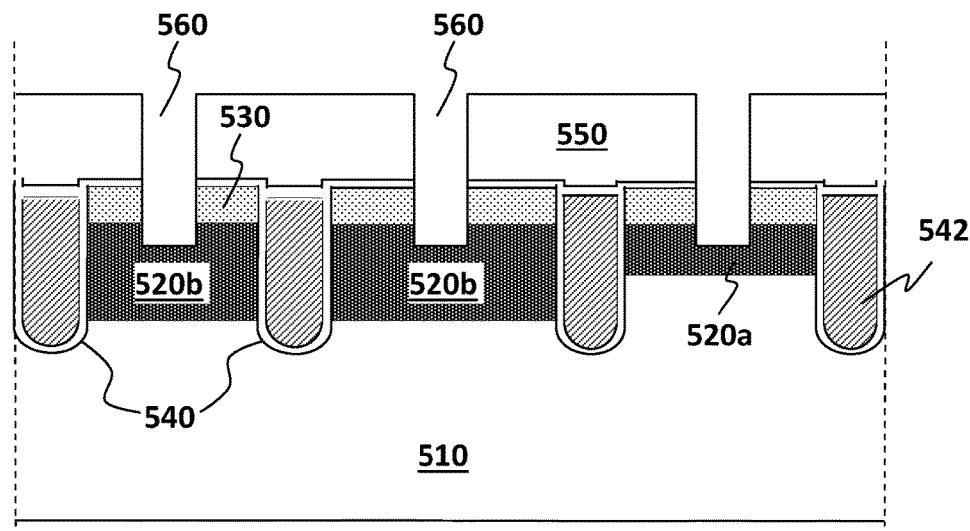
Figure 5J:
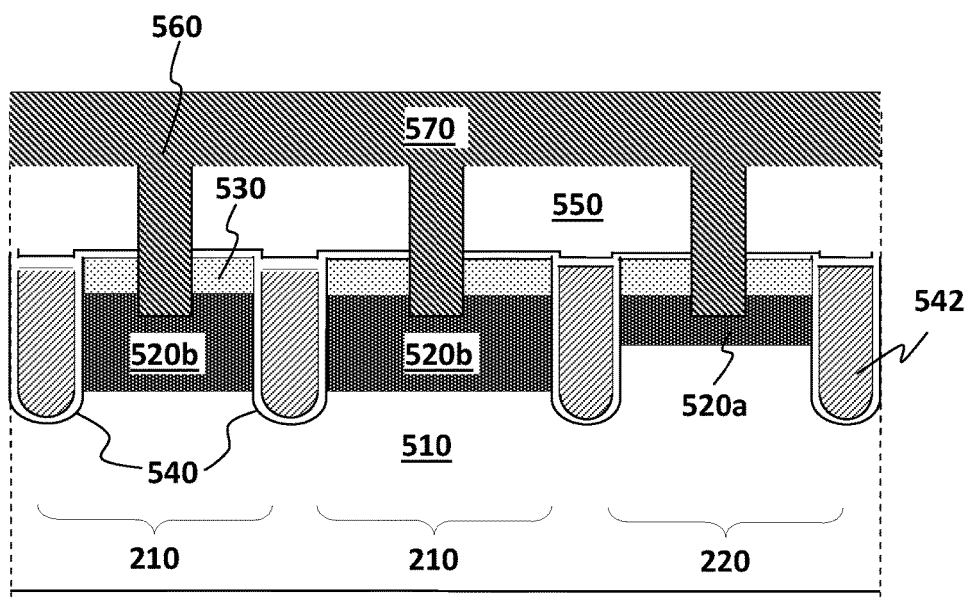

A contact photoresist (not shown) is then applied on the dielectric layer 550 with a pattern that has an opening at the locations of contact trenches. An etch process is performed to remove the uncovered portions of the dielectric layer 550 and form contact trenches 560 through the source region 530 into the body region 520a and 520b as shown in FIG. 5I A metal layer 570 is then deposited to fill the contact openings and to interconnect all the source regions to form the main MOS transistor 210 and MOS transistor 220 connected in parallel.

Threshold Voltage

Figure 6:
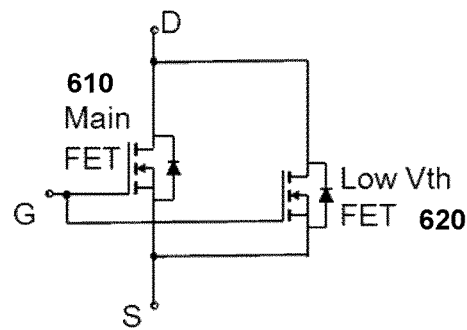
FIG. 6 is a circuit diagram of a switch circuit according to aspects of the present disclosure.

Another approach smoothes the phase node waveform of a synchronous buck converter by replacing the conventional single MOSFET with a main MOS transistor and a parallel secondary MOS transistor with a lower turn-on threshold voltage (Vth). This approach can keep the phase node peak ringing low because the secondary MOS transistor turns on due to its turn-on threshold voltage lower than the phase node voltage spike induced gate spike. Specifically, when the high-side MOSFET turns on, the current drops in the low-side FET. A spike in VDS triggers a high enough VGS spike, and it turns on the secondary MOS transistor with a lower-turn-on threshold voltage and thus reducing the voltage of the phase node spikes. FIG. 6 illustrates a switch 600 circuit according to aspects of the present disclosure. The switch circuit 600 having a first terminal D, a second terminal S and a control terminal G. The switch circuit 600 has two MOSFETs, a main MOS transistor 610 having a regular Vth and a secondary MOS transistor 620 having a lower Vth connected in parallel between the first terminal D and the second terminal S. The main and the secondary MOS transistors 610 and 620 have respective gate terminals coupled to the control terminal G to receive a control signal to turn the main and the secondary MOS transistors 610, 620 on or off.

Figure 7:
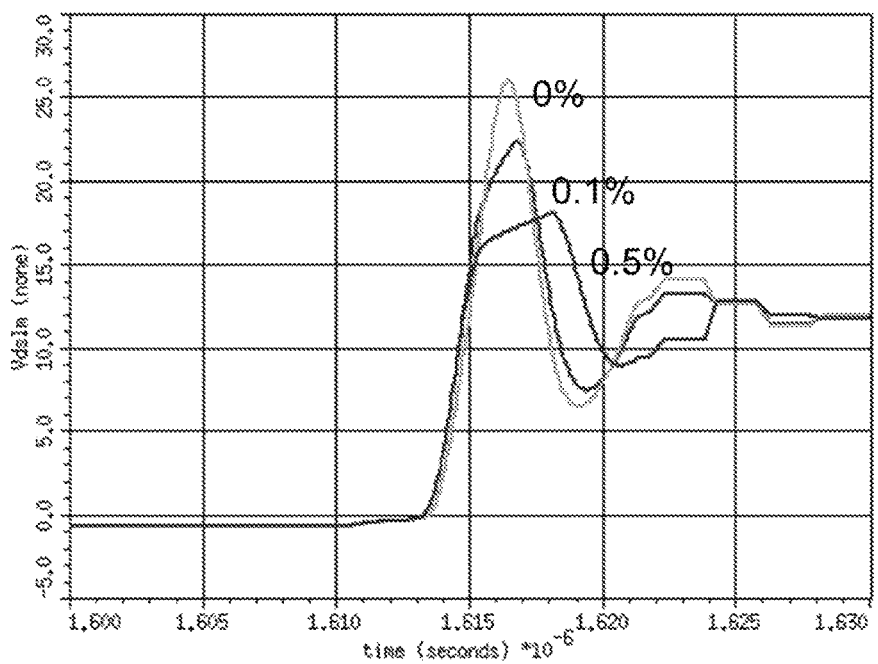
FIG. 7 is a waveform showing the phase node waveform of a switch circuit of FIG. 6.

The main MOS transistor 610 and the secondary MOS transistor 620 are of the same conductivity. The main MOS transistor 610 and the secondary MOS transistor 620 are formed in a common active device area of a common semiconductor substrate. Specifically, each of the main MOS transistor 610 and the secondary MOS transistor 620 comprises one or more trench transistors. Each of the trench transistors has a gate terminal formed in a trench in a semiconductor layer on the common semiconductor substrate, a body region formed in the semiconductor layer and a source region formed proximate the trench. An area of the main MOS transistor 610 is a regular Vth area, and an area of the secondary MOS transistor 620 is a lower Vth area. The ratio of the lower Vth area to the regular Vth area affects the phase node peak voltage. FIG. 7 is a waveform showing that the phase node peak ringing becomes lower with more percentage of the low Vth area in a total area of a common active device area. The ratio may be pre-determined according to the desired reduction on phase node peak voltage. By way of example and not by way of limitation, the low Vth area is between 5% and 15% of a total area of the common active device area. The lower the Vth of the secondary MOS transistor, the lower the area ratio needed to get the desired effect of reduced phase node ringing.

As to the fabrication process for a switch circuit in FIG. 6, two body implants are performed. Specifically, a regular blanket body implant is first performed followed by a second body implant using a body mask. The body mask covers the low Vth area so that dopants ions are only implanted into the regular Vth area in the second body implant. It is noted that threshold voltage can be reduced by low implant energy and can be further reduced by reducing the dose for implant. In some embodiments, the dopant ions (e.g., Boron ions) are implanted into the body regions at a dose of, for example, from about $2e12$ cm$^{-2}$ to about $2e13$ cm$^{-2}$ and an energy of, for example about 50 KeV 1 MeV in the first body implant, and at a dose of, for example, about $2e12$ cm$^{-2}$ to about $2e13$ cm$^{-2}$ and an energy of, for example about 80 KeV~1 MeV in the second body implant. Details of the fabrication process can be found in commonly owned U.S. patent application Ser. No. 14/252,568 filed Apr. 14, 2014, published as U.S. Patent Application Publication 2015/0295495, which describes a switch circuit having a parallel-connected transistor pair; one has a lower threshold voltage than the other. The entire disclosures of U.S. Patent Application Publication 2015/0295495 are incorporated herein by reference.

Figure 2:
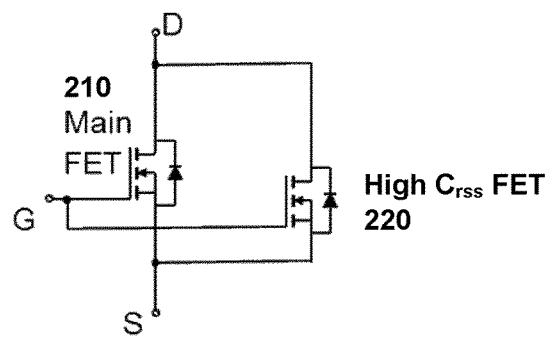
FIG. 2 is a circuit diagram of a switch circuit according to aspects of the present disclosure.
Figure 8:
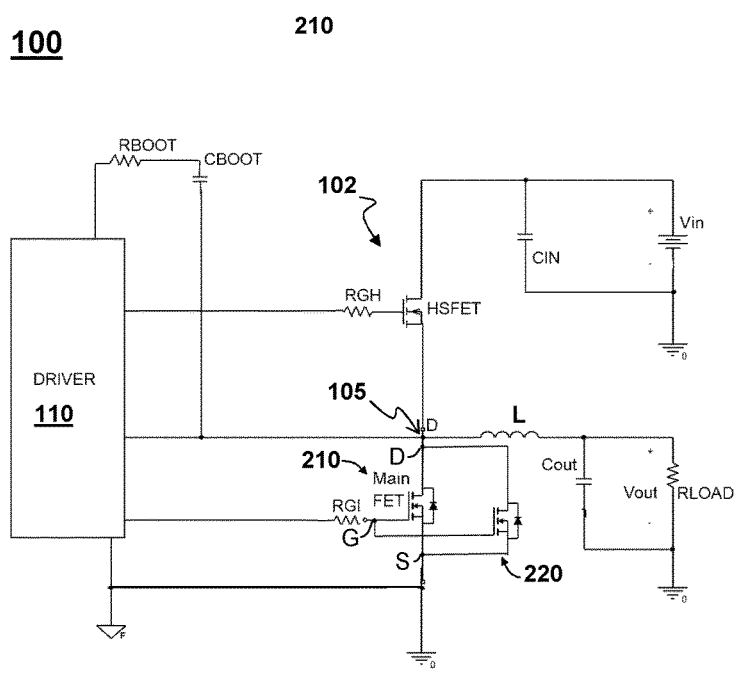
FIG. 8 is a schematic diagram of a buck converter in accordance with aspects of the present disclosure.

As depicted in FIG. 8, switch circuits of the types described herein may be used in buck converters, e.g., as the low-side switch 104 shown in FIG. 1. The buck converter may include e.g., the high-side switch 102 with its own input (e.g., drain) terminal D, output (e.g., source) terminal S, and a low-side control terminal (e.g., gate) G. The input of the low-side switch is connected to the second (output) terminal of the high side switch.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112,¶6.

What is claimed is:

1. A method for forming a switch circuit, comprising:
    forming an array of trench transistor cells in a semiconductor layer of a first conductivity type, the trench transistor cells being defined by trench gate structures, each of said gate trench structures including a trench formed in the semiconductor layer and an insulated gate electrode formed in the trench;
    forming first body regions of a second conductivity type that is opposite the first conductivity type in a first subset of the trench transistor cells, the first body regions and trenches of the first subset of the trench transistor cells being characterized by a first distance from a bottom of the first body regions to a bottom of the gate trenches in the first subset associated with a first reverse gate-to-drain capacitance ($C_{rss}$);
    forming second body regions of the second conductivity type that is opposite the first conductivity type in a second subset of the trench transistor cells, the second body regions and trenches of the second subset of the trench transistor cells being characterized by a second distance from a bottom of the second body regions to a bottom of the gate trenches in the second subset associated with a second reverse gate-to-drain capacitance ($C_{rss}$), wherein the second distance is greater than the first distance; and
    forming source regions in the array of trench transistor cells.

2. The method of claim 1, wherein forming the array of trench transistor cells includes forming the gate trenches in the second subset so that a depth of the bottom of the gate trenches in the second subset is greater than a depth than of the bottom of the gate trenches in the first subset and wherein forming the first and second body regions includes forming the first body regions so that the bottom of the first body regions is the same depth as the bottom of the second body regions.

3. method of claim 2, wherein forming the gate trenches in the second subset so that a depth of the bottom of the gate trenches in the second subset is greater than a depth than of the bottom of the gate trenches in the first subset includes etching trenches in the first and second subsets to a first depth, protecting the trenches in the first subset with a mask while leaving the trenches in the second subset unmasked, and etching the trenches in the second subset to a second depth that is deeper than the first depth.

4. The method of claim 2, wherein forming the gate trenches in the second subset so that a depth of the bottom of the gate trenches in the second subset is greater than a depth than of the bottom of the gate trenches in the first subset includes etching trenches in the second subsets to a specific depth using a first trench mask, then applying a second trench mask to etch the trenches in the first subset with a mask while leaving the trenches in the second subset unmasked, and etching the trenches in the second subset to a second depth that is deeper than the first depth.

5. The method of claim 1, wherein forming the array of trench transistor cells includes forming the gate trenches in the first and second subsets to a common depth of the bottom of the gate trenches in the first and second subsets and wherein forming the first and second body regions includes forming the first body regions so that the bottom of the second body regions is the greater depth than the bottom of the first body regions.

6. The method of claim 5, wherein forming the first body regions so that the bottom of the second body regions is the greater depth than the bottom of the first body regions includes forming the first and second body regions to a first depth using a first implant process at a first implant energy, protecting the second body regions from a second implant with a mask while leaving the first body regions unmasked, and performing a second implant in the first body regions at a second energy that is greater than the first energy.

7. The method of claim 1, wherein forming the array of trench transistor cells includes forming the gate trenches in the second subset so that a depth of the bottom of the gate trenches in the second subset is greater than a depth than of the bottom of the gate trenches in the first subset and wherein forming the first and second body regions includes forming the first body regions so that the bottom of the second body regions is the greater depth than the bottom of the first body regions.

8. The method of claim 1, wherein the first subset of transistor cells forms a first MOS transistor and wherein the second subset of transistor cells forms a second MOS transistor.

9. The method of claim 8, wherein a transistor area of the second MOS transistor is between 0.1% and 15% of a total area of the common active device area.

10. The method of claim 8, wherein the first MOS transistor is a first NMOS transistor and the second MOS transistor is a second NMOS transistor.

11. The method of claim 10, wherein each of the first NMOS transistor and the second NMOS transistor comprises one or more trench transistors, each of the one or more trench transistors having a gate terminal formed in a trench in an N-type semiconductor layer on the common N-type semiconductor substrate, a P-type body region formed in the semiconductor layer and an N-type source region formed proximate the trench.

* * * * *